US 11,508,589 B2

United States Patent
Kai et al.

(10) Patent No.: US 11,508,589 B2
(45) Date of Patent: Nov. 22, 2022

(54) SUBSTRATE PROCESSING METHOD, SUBSTRATE PROCESSING APPARATUS AND RECORDING MEDIUM

(71) Applicant: Tokyo Electron Limited, Tokyo (JP)

(72) Inventors: Akiko Kai, Kumamoto (JP); Kouichirou Tanaka, Kumamoto (JP); Hiroshi Ichinomiya, Kumamoto (JP); Masahiro Fukuda, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/139,392

(22) Filed: Sep. 24, 2018

(65) Prior Publication Data

US 2019/0096706 A1 Mar. 28, 2019

(30) Foreign Application Priority Data

Sep. 25, 2017 (JP) .............................. JP2017-183823

(51) Int. Cl.
*H01L 21/67* (2006.01)
*H01L 21/02* (2006.01)
*H01L 21/687* (2006.01)

(52) U.S. Cl.
CPC .... *H01L 21/67051* (2013.01); *H01L 21/6715* (2013.01); *H01L 21/67034* (2013.01); *H01L 21/68764* (2013.01); *H01L 21/02054* (2013.01)

(58) Field of Classification Search
CPC ......... H01L 21/02046; H01L 21/02052; H01L 21/02054; H01L 21/02057;
(Continued)

(56) References Cited

U.S. PATENT DOCUMENTS

2007/0277930 A1* 12/2007 Yokoyama ........ H01L 21/67207
156/345.31
2008/0016714 A1* 1/2008 Kaneyama ........ H01L 21/67051
34/317
(Continued)

FOREIGN PATENT DOCUMENTS

JP 2012-019002 A 1/2012
JP 2012-165000 A 8/2012
JP 2016-072557 A 5/2016

OTHER PUBLICATIONS

E. Shashi Menon and Pramila S. Menon, Section 4.1 Velocity of Flow, Working Guide to Pumps and Pumping Stations—Calculations and Simulations (Elsevier 2010) (Year: 2010).*

*Primary Examiner* — Mikhail Kornakov
*Assistant Examiner* — Richard Z. Zhang
(74) *Attorney, Agent, or Firm* — Pearne & Gordon LLP

(57) ABSTRACT

When performing a liquid processing on a substrate W being rotated and removing a processing liquid by a cleaning liquid, a cleaning liquid nozzle 421 configured to discharge a cleaning liquid slantly with respect to a surface of the substrate W toward a downstream side of a rotational direction of the substrate W and a gas nozzle 411 configured to discharge a gas toward a position adjacent to a central portion side of the substrate W when viewed from a liquid arrival position R of the cleaning liquid are moved from the central portion side toward a peripheral portion side. A rotation number of the substrate is varied such that rotation number in a period during which the liquid arrival position R moves in the second region becomes smaller than a maximum rotation number in a period during which the liquid arrival position moves in the first region.

10 Claims, 10 Drawing Sheets

(58) Field of Classification Search
CPC ......... H01L 21/67028; H01L 21/67034; H01L 21/67051; H01L 21/6715; H01L 21/02–0279; H01L 21/67–67796; H01L 21/00–86

See application file for complete search history.

(56) References Cited

U.S. PATENT DOCUMENTS

| | | | | |
|---|---|---|---|---|
| 2012/0006361 | A1* | 1/2012 | Miyagi | H01L 21/67051 134/30 |
| 2013/0174873 | A1* | 7/2013 | Yoshihara | H01L 21/67034 134/19 |
| 2016/0096203 | A1* | 4/2016 | Kai | H01L 21/0206 134/30 |

* cited by examiner

SUBSTRATE PROCESSING METHOD, SUBSTRATE PROCESSING APPARATUS AND RECORDING MEDIUM

CROSS-REFERENCE TO RELATED APPLICATION

This application claims the benefit of Japanese Patent Application No. 2017-183823 filed on Sep. 25, 2017, the entire disclosures of which are incorporated herein by reference.

TECHNICAL FIELD

The various aspects and embodiments described herein pertain generally to a technique of supplying a cleaning liquid onto a substrate being rotated and then removing a processing liquid on the substrate.

BACKGROUND

In a manufacturing process for a semiconductor device, there is known a processing (substrate processing method) in which, after performing a liquid processing by supplying a processing liquid onto a surface of a semiconductor wafer (hereinafter, simply referred to as "wafer") as a substrate while rotating the wafer, the processing liquid remaining on the surface of the wafer is removed by changing a liquid to be supplied to a cleaning liquid.

Further, there is also known a method in which, while supplying the cleaning liquid and a gas for pushing away the cleaning liquid at the same time, supply positions of the cleaning liquid and the gas are moved from a central portion of the wafer toward a peripheral portion thereof, thus allowing the cleaning liquid to be pushed away and the wafer to be dried resultantly (see, for example, Patent Document 1).

When pure water needs to be used as the cleaning liquid in performing such processings, there may be a condition where it is difficult to supply the cleaning liquid onto the surface of the wafer uniformly, as in a case where the surface of the wafer is water-repellent, for example.

Further, since a linear velocity at the peripheral portion of the substrate being rotated is high, the cleaning liquid containing the component of the processing liquid may be scattered outwards to collide with a cup or the like disposed around the substrate, causing a liquid splash. This liquid splash may cause generation of a residue defect. In particular, as a pattern formed on the surface of the wafer is further miniaturized, even a liquid splash which has not been regarded as being problematic conventionally needs to be suppressed.

Here, Patent Document 2 discloses a technique of supplying IPA (Isopropyl Alcohol) as a developing liquid and a nitrogen gas for removing the corresponding IPA at the same time while moving supply positions of the IPA and the nitrogen gas from a central portion of a wafer W toward a peripheral portion thereof when developing a pattern formed on the wafer W by using DSA (Directed Self Assembly) of BCP (Block CoPolymers). Further, Patent Document 2 also describes a technique of discharging the IPA slantly downwards toward a downstream side in a rotational direction of the wafer and along a tangent direction of the wafer W, thus suppressing a splash of the IPA.

However, although Patent Document 2 discloses the cleaning method capable of suppressing the generation of the liquid splash as stated above, there is still a demand for a method capable of diffusing the liquid uniformly on the surface of the wafer while suppressing the liquid splash even when the cleaning liquid is difficult to diffuse on the surface of the wafer W, that is, when the cleaning liquid or the surface of the substrate has high water-repellent property.

Patent Document 1: Japanese Patent Laid-open Publication No. 2012-019002 (paragraphs [0134] and [0135] and FIG. 12A to FIG. 12D)

Patent Document 2: Japanese Patent Laid-open Publication No. 2016-072557 (paragraphs [0039] to [0042] and FIG. 8).

SUMMARY

In view of the foregoing, exemplary embodiments provide a substrate processing method, a substrate processing apparatus and a recording medium capable of removing a processing liquid by supplying a cleaning liquid onto a surface of a substrate securely while suppressing scattering of the cleaning liquid.

In one exemplary embodiment, there is provided a substrate processing method of performing a liquid processing by supplying a processing liquid onto a substrate horizontally held and rotated around a central axis thereof and removing the processing liquid by supplying a cleaning liquid onto the substrate. The substrate processing method includes a discharge position moving process of moving a cleaning liquid nozzle and a gas nozzle from a central portion side of the substrate toward a peripheral portion side thereof. The cleaning liquid nozzle is configured to discharge the cleaning liquid slantly with respect to a surface of the substrate toward a downstream side of a rotational direction of the substrate being rotated, and the gas nozzle is configured to discharge a gas toward a position adjacent to the central portion side of the substrate when viewed from a liquid arrival position where the cleaning liquid reaches the substrate. In the discharge position moving process, when a moving path of the liquid arrival position is divided at an intermediate position between a central portion of the substrate and a peripheral portion thereof and a region between the central portion and the intermediate position is defined as a first region whereas a region between the intermediate position and the peripheral portion is defined as a second region, a rotation number of the substrate is varied such that the rotation number of the substrate in a period during which the liquid arrival position is moved in the second region becomes smaller than a maximum rotation number of the substrate in a period during which the liquid arrival position is moved in the first region.

According to the exemplary embodiments, in moving the liquid arrival position R of the cleaning liquid, which is supplied to the substrate being rotated, from the central portion of the substrate toward the peripheral portion thereof, the rotation number of the substrate is adjusted such that the rotation number in the period during which the liquid arrival position is moved in the second region at the peripheral portion side of the substrate is smaller than the maximum rotation number of substrate in the period during which the liquid arrival position is moved in the first region at the central portion side of the substrate. As a result, in the first region, by setting the rotation number of the substrate to be relatively large, the cleaning liquid is forced to be diffused onto the surface of the substrate. In the meanwhile, in the second region, by setting the rotation number to be relatively small, the cleaning of the surface of the wafer W can be performed while suppressing the scattering of the cleaning liquid.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
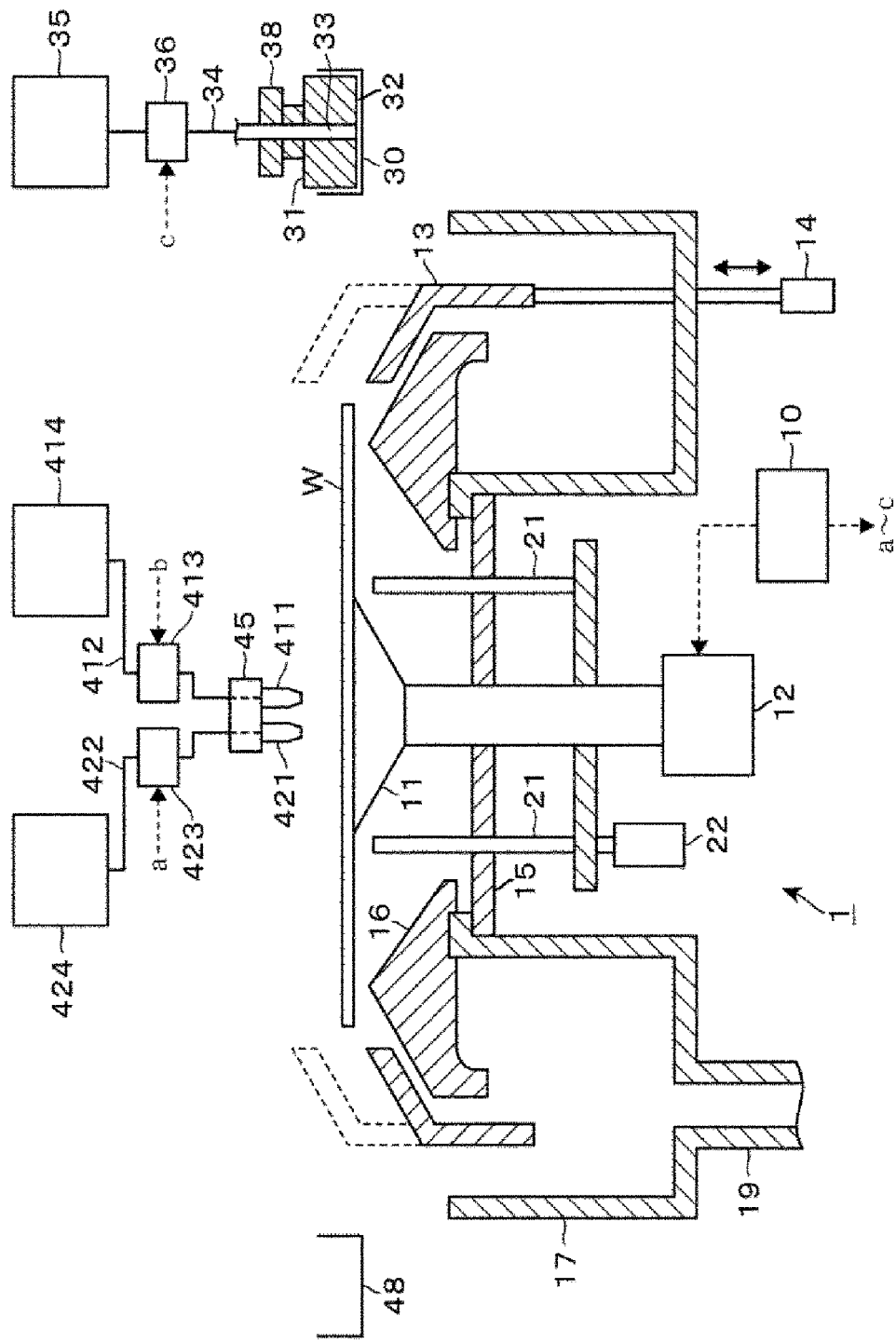
FIG. 1 is a longitudinal side sectional view of a developing apparatus according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, an exemplary embodiment in which the present disclosure is applied to a developing apparatus 1 as a substrate processing apparatus will be explained.

First, an overall configuration of the developing apparatus 1 will be described with reference to a longitudinal side sectional view of FIG. 1 and a plan view of FIG. 2. By way of example, the developing apparatus 1 is configured to perform a developing processing by supplying a developing liquid (processing liquid) onto a wafer W as a circular substrate for use in manufacturing a semiconductor device. The wafer W has a resist film for EUV (Extreme UltraViolet) exposure formed thereon, and this resist film is exposed according to a pattern in an exposure apparatus before the wafer W is transferred into the developing apparatus 1. The resist film for the EUV exposure may have a contact angle equal to or larger than 70°, for example, ranging from 70° to 90° with respect to, for example, DIW (Deionized water, pure water). That is, since this resist film has high water-repellent property, it is difficult to diffuse the DIW uniformly on the surface of the wafer W.

A reference numeral 11 in FIG. 1 denotes a spin chuck as a substrate holding unit, and is configured to hold the wafer W horizontally by attracting a central portion of a rear surface of the wafer W. A reference numeral 12 in FIG. 1 denotes a rotating mechanism configured to rotate the spin chuck 11 such that the wafer W held by the spin chuck 11 is pivoted around a central axis of the wafer W. The rotating mechanism 12 is configured to vary a rotation number of the wafer W per unit time.

A reference numeral 13 in FIG. 1 denotes a recovery cup for receiving a liquid. The recovery cup 13 has a cylindrical shape with an open top, and an upper portion of the recovery cup 13 is inclined inwards. A reference numeral 14 in FIG. 1 denotes an elevating mechanism for the recovery cup 13 and is configured to move the recovery cup 13 up and down between a transfer position (indicated by a solid line in FIG. 1) where the recovery cup 13 is located when a transfer of the wafer W onto/from the spin chuck 11 is performed and a processing position (indicated by a dotted line in FIG. 1) where the recovery cup 13 is located when the developing processing is performed.

Further, a circular plate 15 is provided under the wafer W held by the spin chuck 11, and a guide member 16 having an inverted V-shaped cross section is provided in a ring shape, when viewed from the top, at an outside of the circular plate 15. The guide member 16 guides the developing liquid overflown from the wafer W toward a liquid-receiving unit 17 provided at the outside of the circular plate 15.

The liquid-receiving unit 17 is configured as an annular recess surrounding the spin chuck 11 and is connected to a non-illustrated liquid waste unit via a liquid drain line 19. Further, a gas exhaust line is connected to a bottom surface of the liquid-receiving unit 17 and a gas flown into the liquid-receiving unit 17 is exhausted toward an exhaust unit (the exhaust line and the exhaust unit are not illustrated).

Further, in FIG. 1, a reference numerals 21 denote elevating pins for transferring the wafer W between the spin chuck 11 and an external substrate transfer mechanism (not shown), and a reference numeral 22 denotes an elevating mechanism configured to move the elevating pins 21 up and down.

A reference numeral 31 in FIG. 1 denotes a developing liquid nozzle (processing liquid nozzle) configured to supply a developing liquid onto the wafer W to form a liquid puddle and to develop the resist film. The developing liquid nozzle 31 has a vertically flat shape. A bottom surface 32 of this developing liquid nozzle 31 is a circular horizontal plane smaller than a surface of the wafer W and constitutes a facing surface which faces a part of the surface of the wafer W while the developing processing is being performed.

A discharge opening 33 for the developing liquid is opened vertically downwards at a center of the bottom surface 32. If the developing liquid is discharged from this discharge opening 33, there is created a state in which the bottom surface 32 of the developing liquid nozzle 31 is in contact with the liquid puddle of the developing liquid formed on the surface of the wafer W. In this state, by moving the developing nozzle 31 horizontally above the wafer W being rotated, the developing processing is performed.

By relatively changing a positional relation between the surface of the wafer W being rotated and the bottom surface 32 of the developing liquid nozzle 31 being moved horizontally, an interfacial tension is applied. Accordingly, the developing liquid is agitated, and a concentration of the developing liquid is uniformed. In this way, as the developing processing is performed with the developing liquid having the uniform concentration, a CD (Critical Dimension) which is a line width of a pattern to be formed can be uniformed within the surface of the wafer W.

The discharge opening 33 is connected via a developing liquid supply line 34 to a supply source 35 in which the developing liquid is stored. A reference numeral 36 in FIG. 1 denotes a developing liquid supply mechanism provided on the developing liquid supply line 34 and composed of a valve and a mass flow controller. The developing liquid supply mechanism 36 is configured to control a supply and a stop of the supply of the developing liquid into the developing liquid nozzle 31 from the supply source 35 or configured to adjust a flow rate of the developing liquid.

Figure 2:
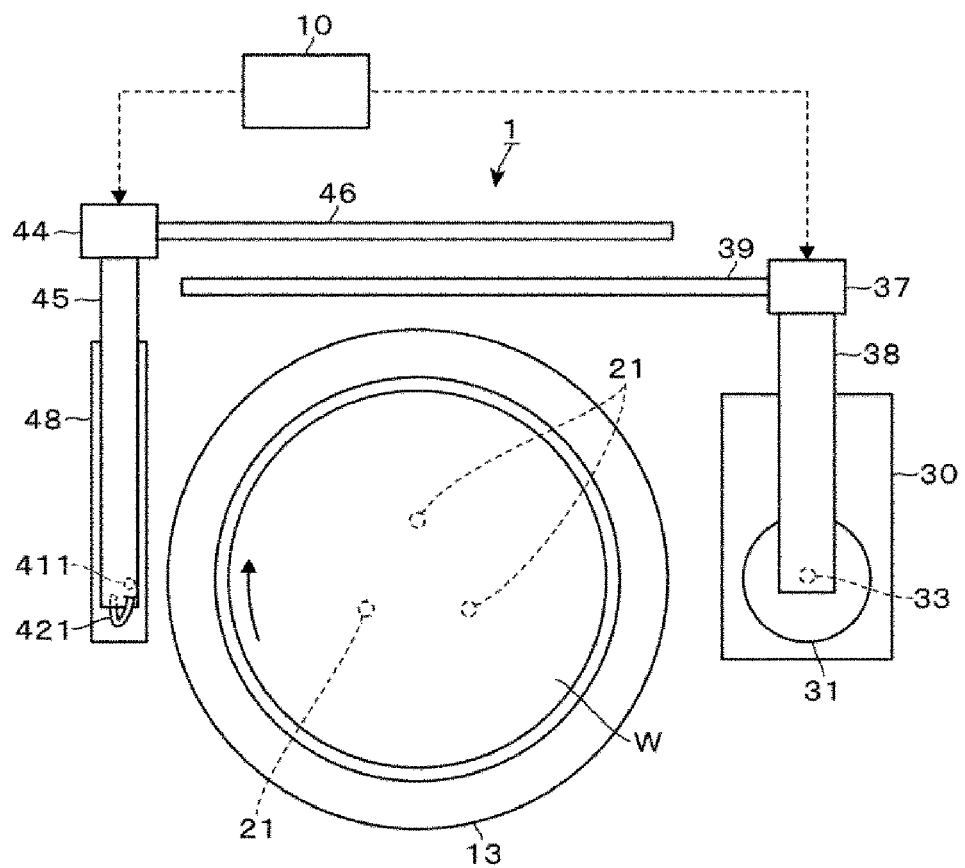
FIG. 2 is a plan view of the developing apparatus.

Further, as depicted in FIG. 1 and FIG. 2, the developing liquid nozzle 31 is provided at a tip end portion of the arm 38 and can be moved by a driving mechanism 37 provided at a base end side of the arm 38. The driving mechanism 37 is configured to be linearly movable in the horizontal direction along a guide 39. With this horizontal movement, the driving mechanism 37 is capable of moving the discharge opening 33 of the developing liquid nozzle 31 along a diametrical direction of the wafer W. Further, the driving mechanism 37 is also capable of moving the developing nozzle 31 via the arm 38 in the vertical direction.

As illustrated in FIG. 2, provided at a side of the recovery cup 13 is a standby unit 30 in which the developing liquid nozzle 31 stands by in a period during which the supply of the developing liquid is not performed. This standby unit 30 is equipped with a cup having an open top, and the developing liquid nozzle 31 can be moved between the inside of the cup of the standby unit 30 and a space above the wafer W through the horizontal movement and the vertical movement by the driving mechanism 37. Within the cup of the standby unit 30, cleaning of the developing liquid nozzle 31 is performed by supplying a cleaning liquid.

Further, the developing apparatus 1 according to the present exemplary embodiment is equipped with: a rinse liquid nozzle (cleaning liquid nozzle) 421 configured to supply a rinse liquid as a cleaning liquid onto the surface of the wafer W after being subjected to the developing processing with the processing liquid to remove the developing liquid from the surface of the wafer W; and a nitrogen gas nozzle (gas nozzle) 411 configured to supply a nitrogen gas for pushing away a liquid film of the rinse liquid to suppress formation of a watermark or the like caused by a residue of the developing liquid component dissolved in the rinse liquid or caused by a residue of the rinse liquid itself.

Figure 3:
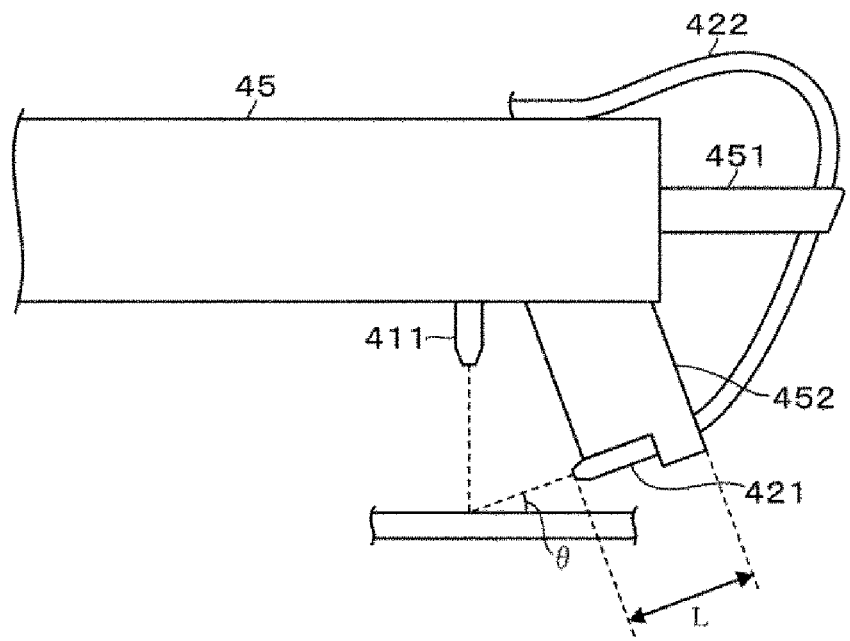
FIG. 3 is an enlarged side view of an arm equipped with a rinse liquid nozzle and a nitrogen gas nozzle.
Figure 4:
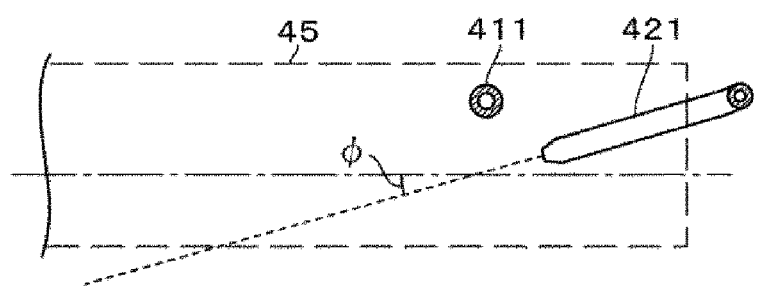
FIG. 4 is a plan view illustrating a layout of the nozzles provided at the arm.

As depicted in FIG. 3 and FIG. 4, the rinse liquid nozzle 421 and the nitrogen gas nozzle 411 according to the present exemplary embodiment are provided at a tip end portion of a common arm 45.

By way of example, the rinse liquid nozzle 421 is provided at an end of a rinse liquid supply line 422 which is wound from a top surface side of the arm 45 to a bottom surface of the arm 45 via the tip end portion thereof. The rinse liquid nozzle 421 discharges the DIW as the rinse liquid slantly downwards toward the wafer W horizontally held by the spin chuck 11. An angle θ formed between the rinse liquid discharged from the rinse liquid nozzle 421 and the surface of the wafer W is set to be of a value ranging from 10° to 40°, desirably, 15° to 25°.

If a value of the angle θ is set to be small (if the discharge angle is set to be an acute angle), an impact inflicted on the wafer W when the rinse liquid arrives on the surface of the wafer W is reduced, so that the rinse liquid can be suppressed from being scattered. Meanwhile, if the value of the angle θ is set to be excessively small, a distance from a tip end of the rinse liquid nozzle 421 to a liquid surface of the rinse liquid is shortened too much. In such a case, there is a concern that the rinse liquid nozzle 421 may come into contact with the liquid film of the rinse liquid or the wafer W, or a cut-off of the liquid may not be performed effectively when the supply of the rinse liquid is stopped.

Further, in FIG. 1 and FIG. 6 to FIG. 9 which show the rinse liquid nozzle 421 schematically, illustration of the inclined arrangement of the rinse liquid nozzle 421 is omitted for the simplicity of illustration.

As shown in FIG. 3, in the rinse liquid nozzle 421 according to the present exemplary embodiment, a shape of placement of the rinse liquid supply line 422 connected to the rinse liquid nozzle 421 is adjusted by supply line supporting members 451 and 452 provided on a side surface and a bottom surface at the tip end portion of the arm 45. At this time, the shape of the placement of the rinse liquid supply line 422 is adjusted such that a path through which the rinse liquid is flown is not curved but straight.

The rinse liquid nozzle 421 is configured to discharge the rinse liquid toward the wafer W from an end position of the straight path.

By way of non-limiting example, a length L of the straight path is set to be equal to or larger than 10 mm, more appropriately, equal to or larger than 20 mm. As found out through experiments, by discharging the rinse liquid from this position allowing the rinse liquid to be flown in the straight path of the sufficient length, a variation of a flow rate of the rinse liquid discharged from the rinse liquid nozzle 421 or a turbulence of a discharge flow is suppressed, so that uniform cleaning can be performed on the surface of the wafer W.

FIG. 4 illustrates a layout of the tip end portion of the rinse liquid nozzle 421 seen from the top. The rinse liquid nozzle 421 of the exemplary embodiment is arranged to discharge the rinse liquid in a direction deviated by an angle φ from an extension direction of the arm 45 indicated by a dashed dotted line.

As shown in FIG. 2, the rinse liquid nozzle 421 provided at the tip end portion of the arm 45 is placed at a position where the rinse liquid nozzle 421 discharges the rinse liquid toward the downstream side in a rotational direction of the wafer W.

Further, by using a driving mechanism 44 to be described later, if the rinse liquid nozzle 421 is disposed at a position allowing a liquid arrival position R at which the rinse liquid arrives on the wafer W to be moved along a radial direction of the wafer W, the rinse liquid can be discharged in the direction deviated toward the peripheral portion of the wafer W by the angle φ with respect to the rotational direction of the wafer W (see FIG. 5A).

Figure 9A:
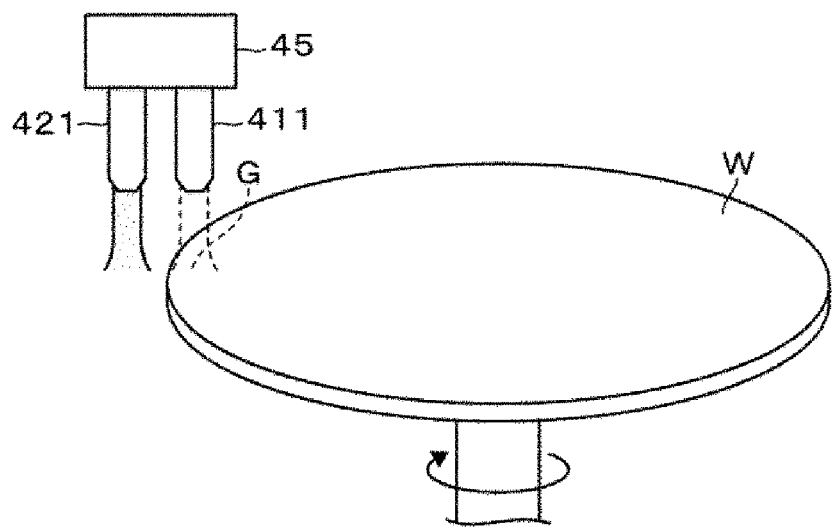
FIG. 9A and FIG. 9B are diagrams for describing a fourth operation of the developing apparatus.
Figure 9B:
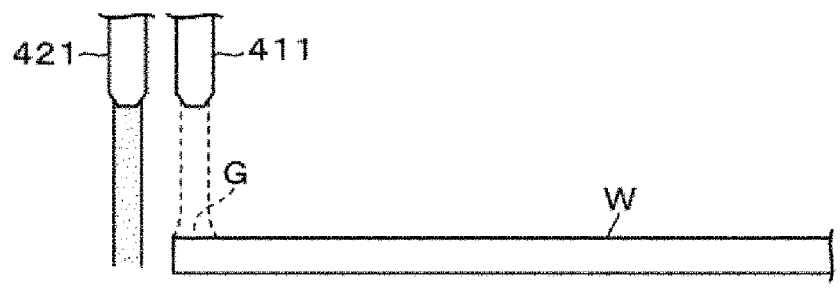

As a result, without moving the rinse liquid nozzle 421 to the outside of the wafer W, as shown in FIG. 9B, the rinse liquid can be supplied from a center of the wafer W to an edge thereof while the rinse liquid nozzle 421 is positioned close to the wafer W. Accordingly, the recovery cup 13 for receiving the liquid, which is provided around the wafer holding unit or the wafer, can be provided at a position closer to the wafer W, and a notch or the like formed to avoid the interference with the rinse liquid nozzle 421 may not be provided in the recovery cup 13. Thus, it is possible to efficiently receive the rinse liquid scattered from the wafer W and suppress the liquid from adhering to the outside of the recovery cup 13.

An appropriate range for the angle ϕ will be explained after describing a configuration and a layout of the nitrogen gas nozzle 411.

As illustrated in FIG. 1, the rinse liquid nozzle 421 is connected to a rinse liquid source 424 via the rinse liquid supply line 422. The rinse liquid supply line 422 is provided with a rinse liquid supply mechanism 423 composed of a valve and a mass flow controller. The rinse liquid supply mechanism 423 is configured to control a supply and a stop of the supply of the rinse liquid into the rinse liquid nozzle 421 from the rinse liquid source 424 or configured to adjust a flow rate of the rinse liquid.

Here, an opening diameter of the rinse liquid nozzle 421 is in a range from, by way of example, but not limitation, 1.5 mm to 2.5 mm. The rinse liquid nozzle 421 supplies the rinse liquid having the flow rate ranging from 200 ml/min to 450 ml/min at a flow velocity ranging from 0.5 m/sec to 4.5 m/sec. Accordingly, it is possible to reduce generation amount of a residue defect on the wafer W which is dried after being subjected to the developing processing.

If the flow velocity of the rinse liquid is too high, the residue defect may be caused as a result of the liquid splash from the wafer W, whereas if the flow velocity of the rinse liquid is too low, a uniform liquid film may not be formed due to the lack of the liquid amount, which may result in insufficient cleaning and the resultant generation of the residue deflect.

Furthermore, there is conducted preliminary evaluation in which the cleaning of the wafer W is performed by using a plurality of nozzles having different opening diameters ranging from 0.6 mm to 2.5 mm, while varying the supply flow rate of the rinse liquid. As a result, it is found that there is a condition suitable for removing the developing liquid while reducing the residue defect by combining the flow rate in the range from 200 ml/min to 450 ml/min allowing the flow velocity to be in the range from 0.5 m/sec to 4.0 m/sec and the opening diameter of the nozzle in the range from 1.5 mm to 2.5 mm. On this ground, these ranges are regarded as the basis for the aforementioned appropriate condition of the rinse liquid.

Now, the nitrogen gas nozzle 411 will be explained. As depicted in FIG. 3 and FIG. 4, the nitrogen gas nozzle 411 is configured to discharge the nitrogen gas vertically downwards from the bottom surface side of the tip end portion of the arm 45.

Figure 5A:
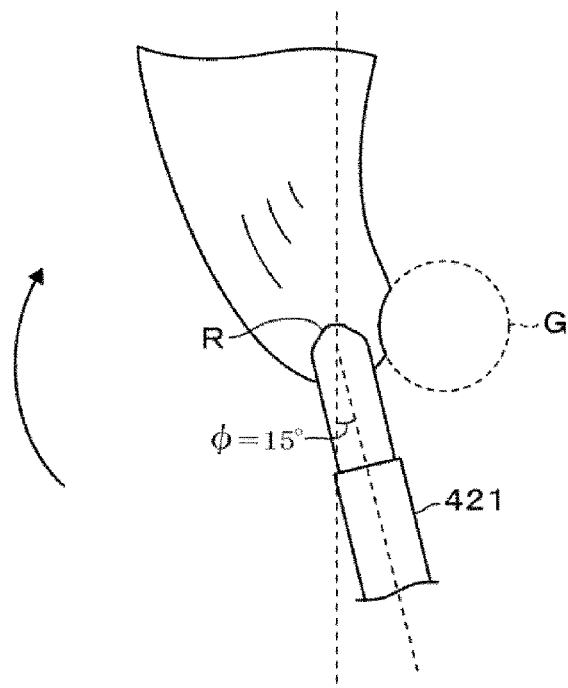
FIG. 5A and FIG. 5B are schematic diagrams illustrating a layout relation between the rinse liquid nozzle and the gas nozzle.
Figure 5B:
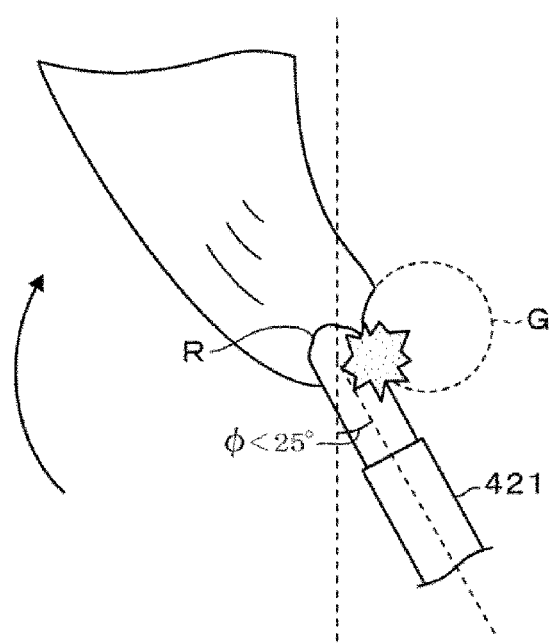

A position on the surface of the wafer W where the rinse liquid discharged slantly downwards from the rinse liquid nozzle 421 reaches is referred to a liquid arrival position R, as shown in FIG. 5A which is an enlarged plan view illustrating the surface of the wafer W. Here, the nitrogen gas nozzle 411 is provided at a position where it discharges the nitrogen gas toward a position adjacent to the liquid arrival position R at the central portion side of the wafer W in the diametrical direction.

A positional relation between a center of the liquid arrival position R of the rinse liquid and a center of a gas arrival position G on the surface of the wafer W where the nitrogen gas discharged from the nitrogen gas nozzle 411 reaches is fixed relatively to each other, and a distance therebetween is set to be in a range from, by way of non-limiting example, 6 mm to 10 mm. It is found out through preliminary evaluation that by setting the distance between the liquid arrival position R and the gas arrival position G to a value within the aforementioned range, the scattering of the rinse liquid and the generation of the residue defect can be suppressed.

Now, there will be described an influence of the discharge angle ϕ of the rinse liquid from the rinse liquid nozzle 421 with respect to the rotational direction of the wafer W when viewed from the top. If this discharge angle is set to be zero (ϕ=0°), an interface between the rinse liquid having reached the liquid arrival position R and the nitrogen gas having reached the gas arrival position G is increased, so there is a concern that the scattering of the rinse liquid may be increased.

Meanwhile, by setting the discharge angle ϕ to be equal to or lager than 10° and less than 25°, as shown in FIG. 5A, the interface between the rinse liquid and the nitrogen gas is reduced, so that the scattering of the rinse liquid can be suppressed. It is found out through preliminary evaluation that by reducing the interface between the rinse liquid and the nitrogen gas, the scattering of the rinse liquid can be suppressed even if the flow rate of the nitrogen gas is varied in a wide range.

Further, if the discharge angle ϕ is set to be large equal to or larger than 25°, the discharge flow of the rinse liquid discharged from the rinse liquid nozzle 421 may come into contact with the gas flow of the nitrogen gas discharged from the nitrogen gas nozzle 411, raising a likelihood that the scattering of the rinse liquid may occur.

Thus, in the rinse liquid nozzle 421 of the present exemplary embodiment, the discharge angle ϕ is set to be in the range equal to or larger than 10° and less than 25° at which the scattering of the rinse liquid is most suppressed.

As shown in FIG. 1, the nitrogen gas nozzle 411 is connected to a nitrogen gas source 414 via a nitrogen gas supply line 412. The nitrogen gas supply line 412 is provided with a nitrogen gas supply mechanism 413 composed of a valve and a mass flow controller. The nitrogen gas supply mechanism 413 is configured to control a supply and a stop of the supply of the nitrogen gas from the nitrogen gas source 414 into the nitrogen gas nozzle 411 or configured to adjust a flow rate of the nitrogen gas.

The nitrogen gas in a range from, by way of non-limiting example, 3 L/min to 6 L/min is supplied from the nitrogen gas nozzle 411.

Preliminary evaluation is performed by conducting the same operation as in the cleaning processing (refer to the description of FIG. 6 to FIG. 10 to be described later) while varying the distance between centers of the liquid arrival position of the rinse liquid and the gas arrival position of the nitrogen gas and varying the flow rate of the nitrogen gas. Through this evaluation, it is proved that the scattering of the rinse liquid and the defect generation are suppressed within the aforementioned flow rate range of the nitrogen gas from 3 L/min to 6 L/min.

As depicted in FIG. 1 and FIG. 2, a driving mechanism 44 is provided at a base end side of the arm 45 by which the rinse liquid nozzle 421, the nitrogen gas nozzle 411 are held. The driving mechanism 44 is configured to be linearly movable in the horizontal direction along a guide 46. With this horizontal movement, the driving mechanism 44 is capable of moving the rinse liquid nozzle 421 and the nitrogen gas nozzle 411 from the central portion of the wafer W toward the peripheral portion thereof in the diametrical direction of the wafer W being rotated. Further, the driving mechanism 44 is also capable of moving the rinse liquid nozzle 421 and the nitrogen gas nozzle 411 via the arm 45 in the vertical direction.

The arm 45, the driving mechanism 44 and the guide 46 correspond to a nozzle moving mechanism according to the present exemplary embodiment.

A reference numeral 48 in FIG. 2 denotes a standby unit where the nitrogen gas nozzle 411 and the rinse liquid nozzle 421 stand by when the supply of the rinse liquid onto the wafer W is not performed. This standby unit 48 has the same configuration as the standby unit 30 for the aforementioned developing liquid nozzle 31. By way of example, the standby unit 48 is disposed at a position opposite to the standby unit 30 for the developing liquid nozzle 31 with the recovery cup 13 therebetween.

By the horizontal movement and the vertical movement using the driving mechanism 44, the rinse liquid nozzle 421 and the nitrogen gas nozzle 411 can be moved between the inside of a cup of the standby unit 48 and the space above the wafer W.

Further, as illustrated in FIG. 1 and FIG. 2, the developing apparatus 1 is equipped with a control unit 10. This control unit 10 is implemented by a computer composed of a CPU and a recording medium having programs stored thereon. The programs include commands (step groups) for performing a developing processing including the supply of the developing liquid and the subsequent supply of the rinse liquid to be described later by outputting control signals to the individual components of the developing apparatus 1 from the control unit 10. To be more specific, the control unit 10 controls various operations such as the rotation number of the wafer W, the horizontal and vertical movements of the respective nozzles 31, 421 and 411, the supply and stop of the supply of the developing liquid, the rinse liquid and the nitrogen gas from these nozzles 31, 421 and 411 and the adjustment of the flow rates thereof.

Particularly, after performing the development of the resist film by supplying the developing liquid onto the wafer W, when removing the developing liquid by supplying the rinse liquid, the control unit 10 according to the present exemplary embodiment changes the rotation number of the wafer W depending on the position of the rinse liquid nozzle 421 or the nitrogen gas nozzle 411. As a result, the rinse liquid can be securely diffused onto the surface of the wafer W having high water-repellent property while suppressing the scattering of the rinse liquid.

Now, an operation of the developing apparatus 1 including the above-described operations will be explained with reference to FIG. 10 and FIG. 11.

First, the wafer W after being subjected to the EUV exposure is carried into the developing apparatus 1 by the non-illustrated external substrate transfer mechanism, and placed on and held by the spin chuck 11. Then, after supplying a small amount of developing liquid by using another nozzle (not illustrated), a pre-wet processing of diffusing the developing liquid on the entire surface of the wafer W is performed.

Thereafter, the developing liquid nozzle 31 is moved from the standby unit 30 to above the peripheral portion of the wafer W, and the developing liquid is supplied toward a gap between the bottom surface of the developing liquid nozzle 31 and the surface of the wafer W while rotating the wafer W at the rotation number of, e.g., 50 rpm.

Thereafter, by moving the developing liquid nozzle 31 from a peripheral portion side of the wafer W being rotated toward a central portion side thereof while discharging the developing liquid from the developing liquid nozzle 31, the liquid puddle of the developing liquid can be diffused onto the entire surface of the wafer W while the developing liquid in the liquid puddle is being agitated.

The resist film is developed by the liquid puddle of the developing liquid formed by the above-described operation, so that the required pattern is formed.

If the development of the resist film by the developing liquid is performed for a preset time period, the developing liquid nozzle 31 is retreated to the standby unit 30 from the position above the wafer W. Meanwhile, the rinse liquid nozzle 421 (arm 45) is moved from the standby unit 48 toward a position where the rinse liquid can be supplied to the central portion of the wafer W.

Figure 6:
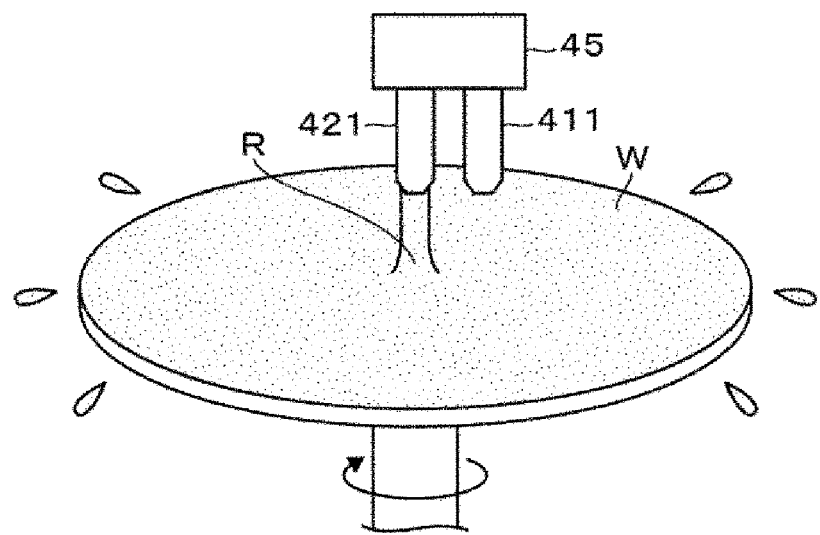
FIG. 6 is a diagram for describing a first operation of the developing apparatus.
Figure 7:
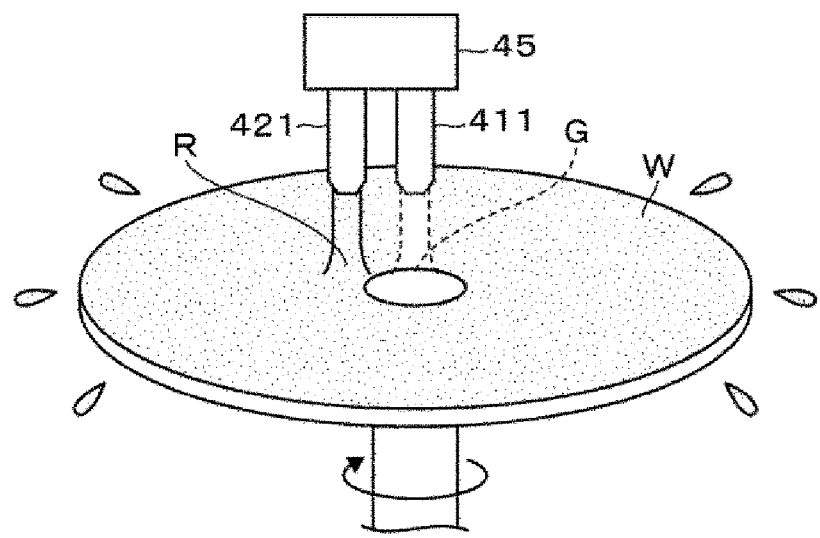
FIG. 7 is a diagram for describing a second operation of the developing apparatus.

Then, by increasing the rotation number of the wafer W in stages within a range from 100 rpm to 1500 rpm while supplying the rinse liquid from the rinse liquid nozzle 421, the rinse liquid is supplied onto the entire surface of the wafer W (FIG. 6).

As a subsequent operation, while supplying the rinse liquid from the rinse liquid nozzle 421, the nitrogen gas is concurrently supplied from the nitrogen gas nozzle 411. Further, the rinse liquid nozzle 421 and the nitrogen gas nozzle 411 are moved from the central portion of the wafer W toward the peripheral portion thereof. Accordingly, the liquid arrival position R of the rinse liquid discharged from the rinse liquid nozzle 421 is moved from the central portion of the wafer W toward the peripheral portion thereof. This operation corresponds to a discharge position moving process according to the present exemplary embodiment.

Further, in the developing apparatus 1 according to the exemplary embodiment, the rotation number of the wafer W is varied depending on the liquid arrival position R of the rinse liquid in a period during which the rinse liquid nozzle 421 and the nitrogen gas nozzle 411 are being moved. Hereinafter, this operation will be explained with reference to FIG. 10 which illustrates the variation of the rotation number of the wafer W during this period.

Figure 10:
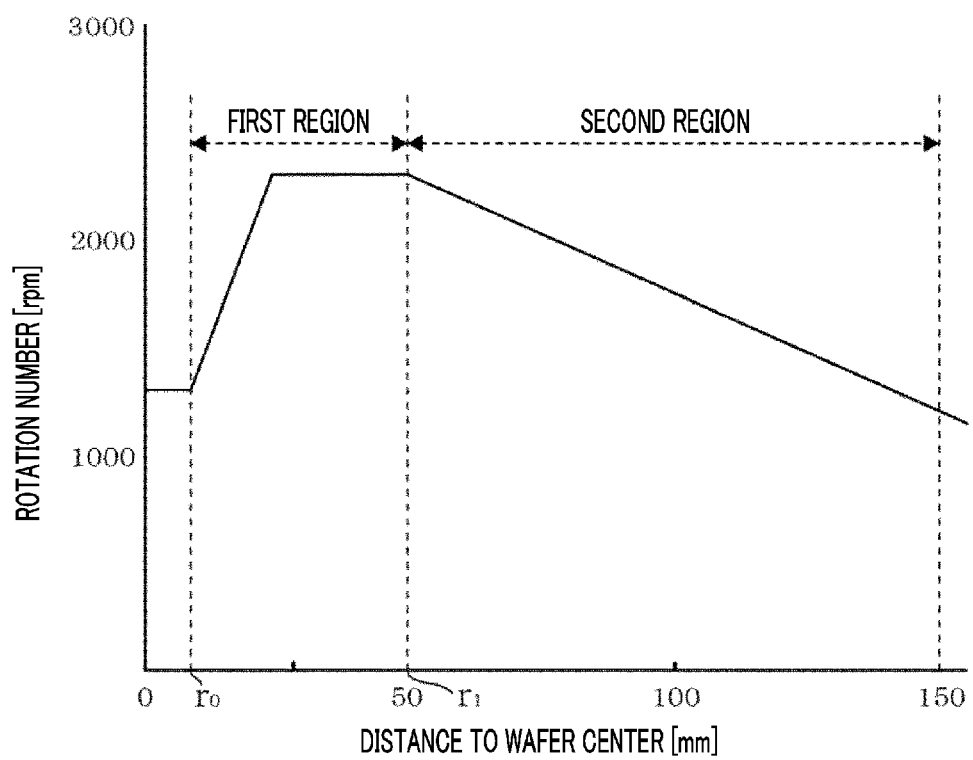
FIG. 10 is a diagram illustrating an example of a variation of a rotation number of a wafer in a period during which a liquid arrival position of a rinse liquid is being moved.

A horizontal axis of FIG. 10 represents a distance (mm) from the liquid arrival position R to the center of the wafer W, and a vertical axis indicates the rotation number (rpm) of the wafer W per unit time which is adjusted depending on the liquid arrival position R.

Referring back to the description of the operation of the developing apparatus 1, after the supply of the rinse liquid onto the entire surface of the wafer W is performed as stated above with reference to FIG. 6, the arm 45 is moved to a position where the nitrogen gas from the nitrogen gas nozzle 411 can be supplied to the central portion of the wafer W while maintaining the rotation number of the wafer W constant.

As a result, as shown in FIG. 10, the liquid arrival position R is slightly moved up to a position $r_0$ around the center of the wafer W.

In this state, if the supply of the nitrogen gas from the nitrogen gas nozzle 411 is begun, the rinse liquid at and around the gas arrival position G of the nitrogen gas is pushed away, so that there is formed a drying region (hereinafter, also referred to as "core") (see FIG. 7) where the rinse liquid is removed.

Subsequently, while keeping on supplying the rinse liquid from the rinse liquid nozzle 421 and the nitrogen gas from the nitrogen gas supply nozzle 411, the arm 45 (the rinse liquid nozzle 421 and the nitrogen gas nozzle 411) is moved from the central portion of the wafer W toward the peripheral portion thereof at a moving speed of, for example, about several mm/sec.

Figure 8A:
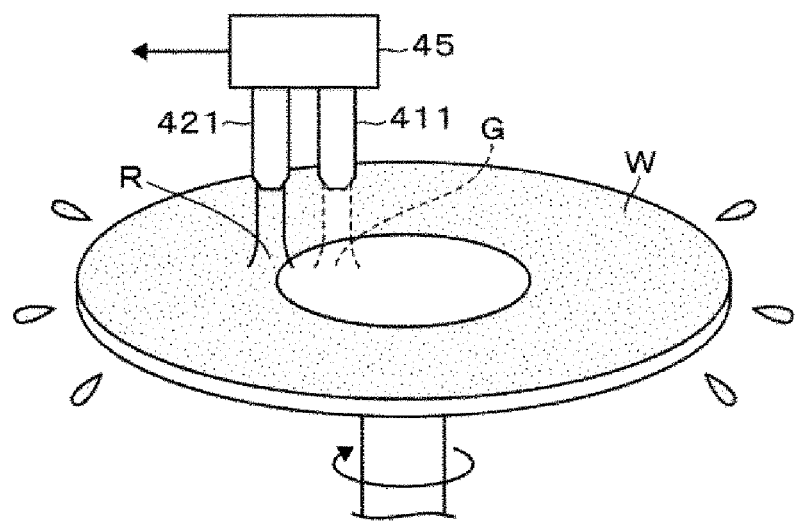
FIG. 8A and FIG. 8B are diagrams for describing a third operation of the developing apparatus.
Figure 8B:
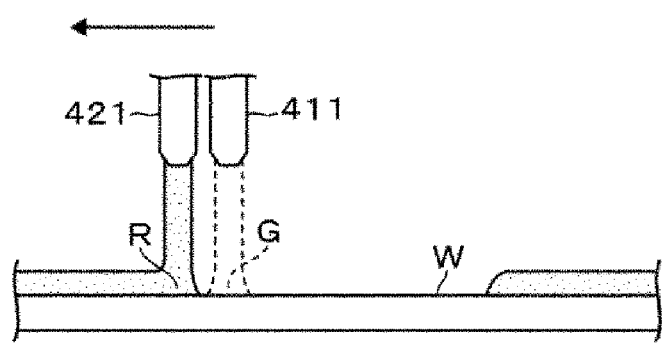

As a result, the liquid arrival position R of the rinse liquid and the gas arrival position G of the nitrogen gas are moved from the central portion of the wafer W toward the peripheral portion thereof, and the core where the rinse liquid is removed is enlarged (see FIG. 8A and FIG. 8B).

Concurrently with this operation, the rotating mechanism 12 continuously increases the rotation number of the wafer W up to, e.g., 2000 rpm to 3000 rpm and then maintains this rotation number of the wafer W constant (first region rotation number adjusting process).

This rotation number of the wafer W corresponds to "maximum rotation number" according to the present exemplary embodiment.

In a region close to the central portion of the wafer W, since a centrifugal force applied to the rinse liquid supplied on the wafer W is relatively small, it is difficult for the rinse liquid to be uniformly diffused outwards in a case where the water-repellent property of the surface of the wafer W is strong.

In view of this, by increasing the rotation number of the wafer W in a period during which the wafer W is being moved in the region ("first region" to be described later) close to the central portion of the wafer W, the centrifugal force applied to the rinse liquid is increased, so that the rinse liquid can be uniformly diffused on the surface of the wafer W.

Further, it is empirically found out that by increasing the rotation number of the wafer W continuously (gradually) from the rotation number immediately before the beginning of the supply of the nitrogen gas to the maximum rotation number, the core having a proper circular shape is easy to form.

If the liquid arrival position R is further moved toward the peripheral portion of the wafer W in the state that the rotation number of the wafer W is maintained to be the maximum rotation number, the centrifugal force exerted on the rinse liquid suppled on the surface of the wafer W is gradually increased.

Even though the centrifugal force exerted on the rinse liquid is increased to the extent that the rinse liquid can be uniformly supplied onto the surface of the wafer W, if the rotation number of the wafer W is maintained to be the maximum rotation number, an impact applied to the rinse liquid at the liquid arrival position R is increased, which may cause the scattering of the rinse liquid.

As a resolution, in the developing liquid 1 according to the present exemplary embodiment, after the liquid arrival position R reaches a preset position (intermediate position $r_1$), the rotation number of the wafer W is continuously (gradually) decreased from the aforementioned maximum rotation number (second region rotation number adjusting process).

By decreasing the rotation number of the wafer W as the liquid arrival position R is moved, it is possible to suppress the scattering of the rinse liquid while maintaining the state in which the rinse liquid can be uniformly supplied onto the surface of the wafer W.

By way of non-limiting example, the intermediate position $r_1$ is set to a position moved from the center of the wafer W in the diametrical direction by a distance within a range from ⅕ to ⅔ of a radius of the wafer W. For example, in case of processing the wafer W having a diameter of 300 mm, the intermediate position $r_1$ is set to a position distanced apart from the center of the wafer W by 50 mm within a range from 30 mm to 100 mm.

Further, in the developing apparatus 1 according to the present exemplary embodiment, a region between the position $r_0$ at the central portion of the wafer W and the intermediate position $r_1$ shown in FIG. 10 corresponds to the first region. Further, a region between the intermediate position $r_1$ and an edge (a position of 150 mm) of the wafer W at the peripheral portion thereof corresponds to a second region.

In addition, regarding a pace at which the rotation number of the wafer W becomes reduced, the rotation number needs to become reduced such that the rotation number of the wafer W reaches the maximum when the liquid arrival position R passes the intermediate position $r_1$, and becomes a value within a range from 1000 rpm to 2000 rpm when the liquid arrival position R reaches the edge of the wafer W.

As stated above, by moving the rinse liquid nozzle 421 and the nitrogen gas nozzle 411 toward the peripheral portion of the wafer W while varying the rotation number of the wafer W depending on the liquid arrival position R of the rinse liquid, the core where the rinse liquid is removed is gradually diffused.

When the liquid arrival position R reaches a position outer than the edge of the wafer W, the rinse liquid is removed from the entire surface of the wafer W, so that the wafer W is completely dried (see FIG. 9A and FIG. 9B).

Here, there may be considered a method in which the nitrogen gas nozzle 411 and the rinse liquid nozzle 421 are arranged in a direction along a moving direction of these nozzles 411 and 421 (that is, a direction along a widthwise direction of the arm 45) in case of supplying the nitrogen gas to the position adjacent to the liquid arrival position R at the central portion of the wafer W in the diametrical direction.

In such a case, however, if it is attempted to move the liquid arrival position R to the position outer than the edge of the wafer W, there is a concern that the discharge flow of the rinse liquid discharged from the rinse liquid nozzle 421 and an upper inner edge of the recovery cup 13 may interfere with each other.

As a resolution, the rinse liquid nozzle 421 according to the present exemplary embodiment is configured to discharge the rinse liquid in a direction deviated toward the peripheral portion of the wafer W by the angle ϕ with respect to the rotational direction of the wafer W. With this configuration, the nitrogen gas nozzle 411 and the rinse liquid nozzle 421 may be arranged in a direction intersecting with the moving direction thereof (that is, a direction along a lengthwise direction of the arm 45), as shown in FIG. 4 and FIG. 11.

Figure 11:
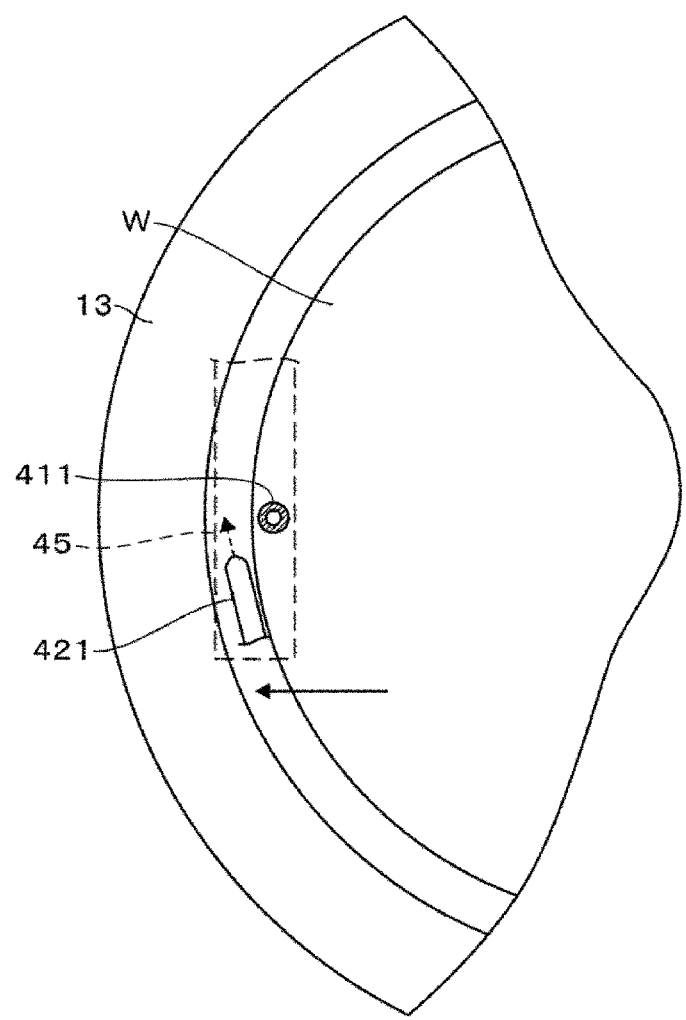
FIG. 11 is an enlarged plan view illustrating a state in which the liquid arrival position reaches a position at an outside of an edge of the wafer.

As a result, as depicted in FIG. 11, the liquid arrival position R can be moved up to the position outer than the edge of the wafer W.

If the entire surface of the wafer W is dried as stated above, the supply of the rinse liquid from the rinse liquid nozzle 421 and the supply of the nitrogen gas from the nitrogen gas nozzle 411 are stopped, and these nozzles 411 and 421 are retreated to the standby unit 48. Thereafter, the rotation of the wafer W is stopped, and the wafer W is transferred back to the external substrate transfer mechanism and then carried out of the developing apparatus 1 in the reverse order as it is carried in, and a carry-in of a next wafer W is awaited.

According to the developing apparatus 1 of the present exemplary embodiment, following effects may be achieved.

In moving the liquid arrival position R of the rinse liquid, which is supplied to the wafer W being rotated, from the central portion of the wafer W toward the peripheral portion thereof, the rotation number of the wafer W is adjusted such that the rotation number in the period during which the liquid arrival position R of the rinse liquid is moved in the second region at the peripheral portion side of the wafer W is smaller than the maximum rotation number of the wafer W in the period during which the liquid arrival position R is moved in the first region at the central portion side of the wafer W. As a result, in the first region, by setting the rotation number of the wafer W to be relatively large, the rinse liquid is forced to be diffused onto the surface of the wafer W. In the meanwhile, in the second region, by setting the rotation number of the wafer W to be relatively small, the cleaning of the surface of the wafer W can be performed while suppressing the scattering of the rinse liquid.

Here, the increase and the decrease of the rotation number of the wafer W in the first and second regions is not limited to adjusting the rotation number of the wafer W continuously as in the example described with reference to FIG. 10.

Figure 12:
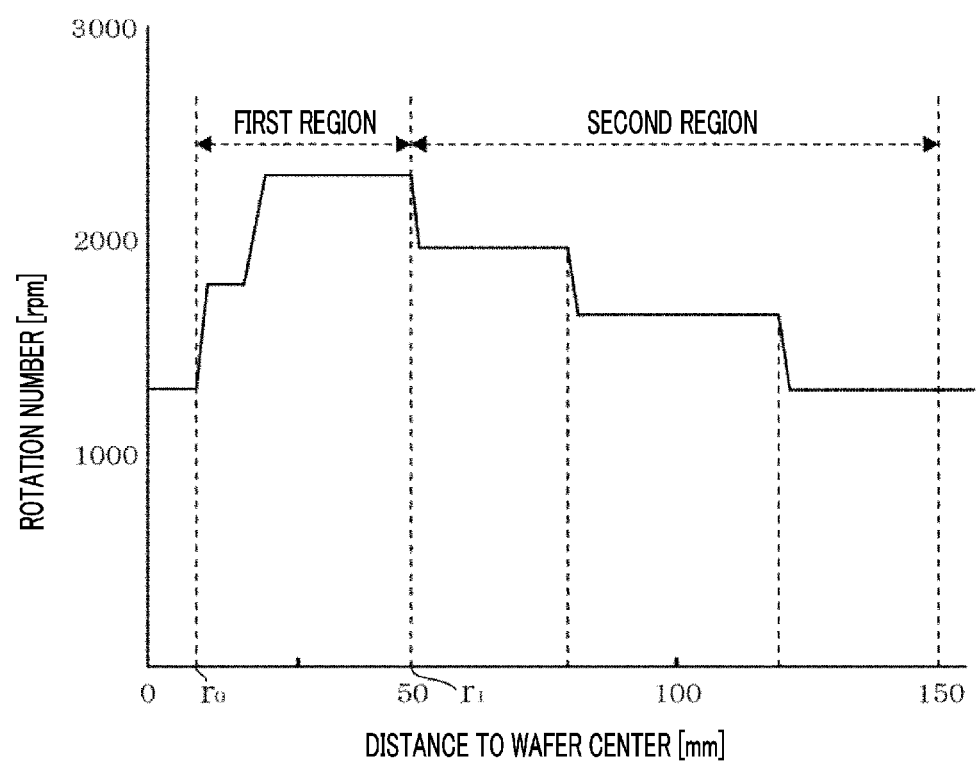
FIG. 12 is a diagram illustrating another example of the variation of the rotation number of the wafer.

By way of non-limiting example, in the first region, the rotation number may be increased up to the maximum rotation number at once or stage by stage in multiple times (FIG. 12 shows an example where the rotation number is increased stage by stage in twice). Further, in the second region, the rotation number may be decreased stage by stage in multiple times, as depicted in FIG. 12.

Furthermore, the exemplary embodiment is not limited to be being applied to the developing processing using the developing liquid or the removal of the developing liquid by the rinse liquid (DIW) in the developing apparatus 1. By way of example, the exemplary embodiment may also be applicable to a liquid processing of performing a developing processing of copolymer using an organic solvent and then removing the organic solvent by using IPA as the cleaning liquid, a liquid processing of performing etching of the wafer W by using an acidic liquid such as fluoric acid and so forth and then removing the acidic liquid by using DIW as the cleaning liquid, and so forth.

Further, the gas supplied from the gas nozzle 411 is not limited to the nitrogen gas. By way of example, it may be possible to push away the cleaning liquid by supplying clean air.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A substrate processing method of performing a liquid processing by supplying a processing liquid onto a substrate horizontally held and rotated around a central axis thereof and removing the processing liquid by supplying a cleaning liquid onto the substrate, the substrate processing method comprising:
   a discharge position moving process of moving a cleaning liquid nozzle and a gas nozzle from a position above a central portion of the substrate toward a position above a peripheral portion thereof, wherein the cleaning liquid nozzle discharges the cleaning liquid slantly with respect to a surface of the substrate toward a downstream side of a rotational direction of the substrate being rotated, and the gas nozzle discharges a gas toward a position adjacent to the position above the central portion of the substrate when viewed from a liquid arrival position where the cleaning liquid reaches the substrate,
   wherein, in the discharge position moving process, a moving path of the liquid arrival position is divided at an intermediate position between the central portion of the substrate and the peripheral portion thereof and a region between the central portion and the intermediate position is defined as a first region, whereas a region between the intermediate position and the peripheral portion is defined as a second region, and a rotation number of the substrate is varied such that the rotation number of the substrate in a period during which the liquid arrival position is moved in the second region becomes smaller than a maximum rotation number of the substrate in a period during which the liquid arrival position is moved in the first region,
   wherein the discharge position moving process includes:
      a first period process during which, at an initial rotation number being lower than the maximum rotation number, the cleaning liquid is diffused on an entire area of the surface of the substrate, and the gas nozzle starts to discharge the gas to form a dry region on the central portion of the substrate, wherein the initial rotation number remains constant during the first period process of forming the dry region in the central portion,
      a second period process during which, after the formation of the dry region in the central portion, the rotation number of the substrate is gradually increased from the initial rotation number up to the maximum rotation number which is the highest in all of the periods during which the discharge position moving process is performed, as the gas nozzle discharging the gas is moved in an outward direction in the first region from the central portion of the substrate toward the peripheral portion thereof, and
      a third period process during which the rotation number of the substrate is gradually decreased as the gas nozzle discharging the gas is moved in the outward direction in the second region,
   wherein the cleaning liquid nozzle discharges the cleaning liquid toward the substrate at a position where the cleaning liquid passes through a straight path having a length equal to or larger than 10 mm at an end of a rinse liquid supply line,
   wherein the rinse liquid supply line is wound from a top surface side to a bottom surface of an arm at which the cleaning liquid nozzle is provided,
   wherein the rinse liquid supply line is supported by a first supporting member extended from the arm in a sideward direction and a second supporting member extended from the arm in a downward direction.

2. The substrate processing method of claim 1,
   wherein, in the third period process, the rotation number of the substrate is decreased such that the rotation number of the substrate falls within a range from 1000 rpm to 2000 rpm at a time when the cleaning liquid nozzle reaches an edge of the substrate.

3. The substrate processing method of claim 1,
wherein the maximum rotation number of the substrate in the first region is in a range from 2000 rpm to 3000 rpm.

4. The substrate processing method of claim 1,
wherein the intermediate position is set to a position deviated from a center of the substrate in a diametrical direction by a distance within a range from ⅕ to ⅔ of a radius of the substrate.

5. The substrate processing method of claim 1,
wherein the cleaning liquid nozzle discharges the cleaning liquid slantly downwards such that an angle of the cleaning liquid nozzle with respect to the surface of the substrate is set to be in a range from 10° to 40°.

6. The substrate processing method of claim 1,
wherein the cleaning liquid nozzle discharges the cleaning liquid toward the peripheral portion of the substrate such that, when viewed from above, an angle of the cleaning liquid nozzle with respect to the rotational direction of the substrate is set to be in a range larger than 10° and less than 25°.

7. The substrate processing method of claim 1,
wherein the cleaning liquid nozzle discharges the cleaning liquid having a flow rate ranging from 200 ml/min to 450 ml/min at a flow velocity in a range from 0.5 m/sec to 4.5 m/sec.

8. The substrate processing method of claim 1,
wherein a distance between a center of the liquid arrival position and a center of a gas arrival position where the gas reaches the substrate is set to be of a value ranging from 6 mm to 10 mm.

9. The substrate processing method of claim 1,
wherein the cleaning liquid is pure water, and the surface of the substrate onto which the cleaning liquid is supplied has water-repellent property with a contact angle of the pure water equal to or larger than 70°.

10. A computer-readable recording medium having stored thereon computer-executable instructions that, in response to execution, cause a substrate processing apparatus, which is configured to perform a liquid processing by supplying a processing liquid onto a substrate, to perform a substrate processing method as claimed in claim 1.

* * * * *